United States Patent
Koumura et al.

[11] Patent Number: 5,456,798
[45] Date of Patent: Oct. 10, 1995

[54] METHODS AND APPARATUS FOR PROCESSING CURVED SURFACE

[75] Inventors: Tukasa Koumura, Toyota; Kiyoshi Saeki, Okazaki, both of Japan

[73] Assignee: Nippondenso Co., Ltd., Kariya, Japan

[21] Appl. No.: 354,775

[22] Filed: Dec. 12, 1994

Related U.S. Application Data

[63] Continuation of Ser. No. 190,928, Feb. 3, 1994, abandoned.

[30] Foreign Application Priority Data

Apr. 16, 1993 [JP] Japan .................................... 5-089739

[51] Int. Cl.$^6$ ........................... H01L 21/506; B44C 1/22; C03C 15/00
[52] U.S. Cl. ................................. 216/66; 156/345
[58] Field of Search ..................... 156/643, 651, 156/654, 659.1, 662, 663, 345; 204/192.32, 192.37

[56] References Cited

U.S. PATENT DOCUMENTS 5,316,640   5/1994   Wakabayashi et al. .............. 156/657 X

OTHER PUBLICATIONS

Shiono, et al: "Reflection micro–Fresnel lenses and their use in an integrated focus sensor", Applied Optics vol. 28, No. 15, Aug. 15, 1989.
Bloomstein, et al: "Laser–Chemical Three–Dimensional Writing of Multimaterial Structures for Microelectromechanics", IEEE, Catalog No. CH2957–Sep. 1991.
1991 Tokai–Section Joint Convention Record of The Six Institutes of Electrical and Related Engineers, Oct. 1992.
JSME Annual Conference on Robotics and Mechatronics 9ROBOMEC'92) – Toward the Realization of Intelligent Machine Systems.
Hisanaga et al, "Fabrication of 3–Dimensionally Shaped Si Diaphragm Dynamic Focusing Mirror", IEEE Proceedings of Micro Electro Mechanical Systems, Feb. 7–10, 1993, pp. 30–35, LC No. 92–56273, IEEE Catalog No. 93CH3265–6.
"An electro–static–force drive type dynamic focusing mirror", an Abstract of a Proceeding of 1992 Tokai–Section Joint Convention Record of the Six Institutes of Electrical and Related Engineers, a symposium regarding micromachine, Oct. 17, 1992, item No. S2–1.

*Primary Examiner*—William Powell
*Attorney, Agent, or Firm*—Cushman, Darby & Cushman

[57] ABSTRACT

In order to perform micromachining of a precision smooth curved surface on a workpiece, light emitted from a mercury lamp is transmitted through a photomask, Fourier transform lens, aperture material, and inverse Fourier transform lens, after which it is beamed upon the workpiece material to be surface-machined and a positive photoresist layer which is formed on the surface of the workpiece material. By means of the foregoing structure, the high-frequency optical components which are included in the light emitted from the mercury lamp and which may cause roughening of curved-surface machining are made to converge at a location away from the optical axis and are removed by means of an aperture provided thereupon, with the only the residual low-frequency optical components being transmitted through the aperture, and so the intensity profile of the light which is beamed upon the positive photoresist layer is smoothed and a smooth-surface curved surface is transcribed to the positive photoresist layer.

18 Claims, 7 Drawing Sheets

OPTICAL INTENSITY PROFILE (A-A)

OPTICAL INTENSITY PROFILE (B-B)

FOURIER SPECTRUM

FIG. 4
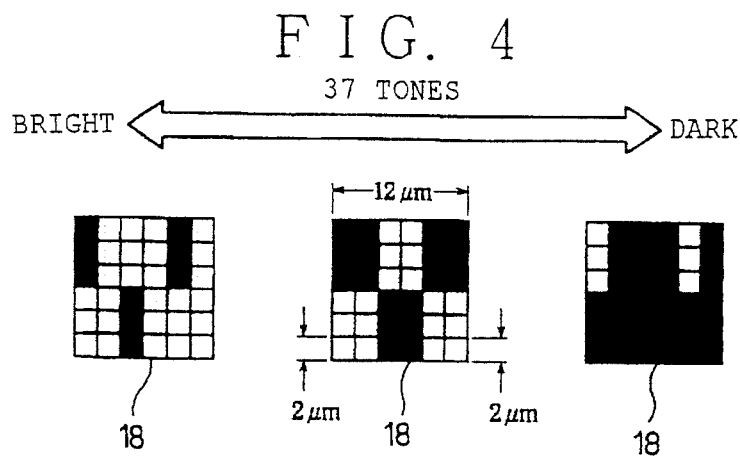
FIG. 5A EXPOSURE
FIG. 5B DEVELOPMENT
FIG. 5C ETCHING
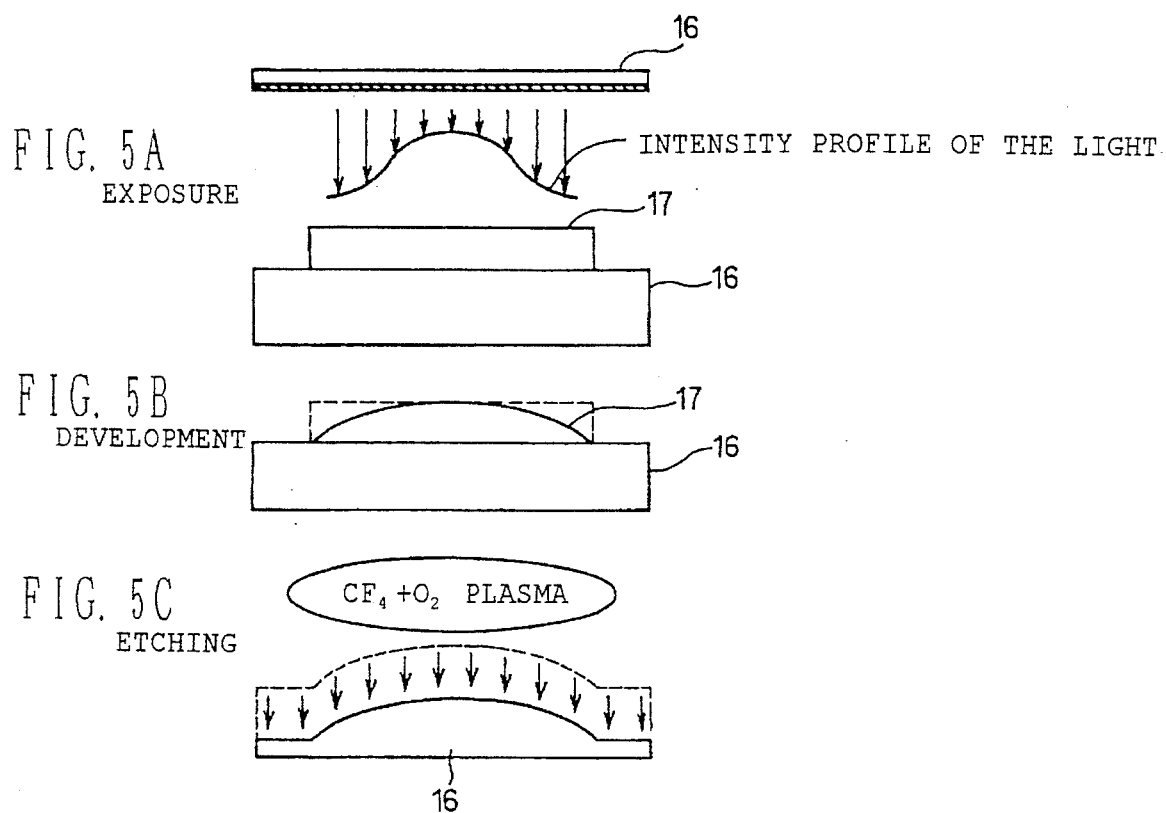

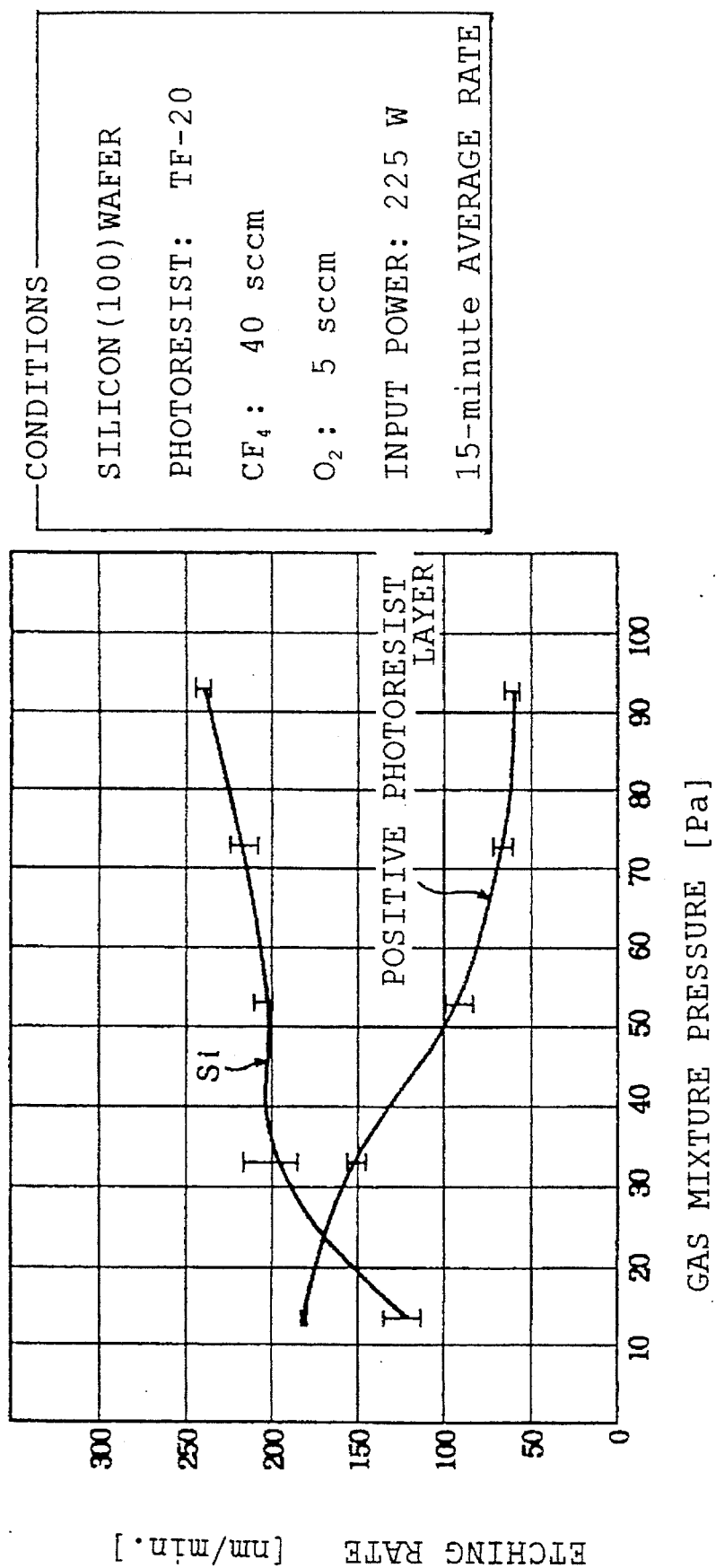

RESIST
APPLICATION

EXPOSURE AND
DEVELOPMENT

HYDROFLUORIC
ACID ETCHING

RESIST
REMOVAL

RESIST
APPLICATION

EXPOSURE AND
DEVELOPMENT

HYDROFLUORIC
ACID ETCHING

RESIST
REMOVAL

PRIOR ART

METHODS AND APPARATUS FOR PROCESSING CURVED SURFACE

This is a continuation of application Ser. No. 8/190,928, filed on Feb. 3, 1994, which was abandoned upon the filling hereof.

BACKGROUND OF THE INVENTION

1. Field of the Invention

The present invention relates to a curved-surface processing or machining method for fabricating a smooth curved surface on a positive photo-resist layer which is formed on a surface of a workpiece, and an apparatus for the same.

2. Description of the Related Art

In recent years, micromachining technologies based on LSI manufacturing technology have been employed to attempt the processing of curved surfaces for ultra-compact optical lenses, acoustic lenses, and the like. These curved-surface machining technologies utilize laser beams, ion beams, and electron beams to fabricate a curved surface of the specified configuration by emitting and scanning of these beams on the surface of the workpiece.

However, as is shown in FIG. 9, with the method whereby the surface of a workpiece 32 is machined by scanning of a beam 31, the intensity profile of the beam 31 is a parabolic distribution which is strong at the center and becomes weaker on the periphery, and so traces of the beam scanning (minute striations extending along the direction of scanning) remain on the workpiece, and the machined surface becomes rough, making this unsuitable for the delicate machining demanded for the precision smooth curved surfaces of lenses and the like. Moreover, because beam scanning must be repeated many times to obtain the specified machining configuration, this has the drawbacks of long overall machining times and poor machining efficiency.

This invention has taken these circumstances into account, and an object is to provide a method for processing or machining curved surfaces capable of delicate machining of precision smooth curved surfaces on a workpiece with good efficiency, and an apparatus for the same.

SUMMARY OF THE INVENTION

In order to achieve the aforementioned object, the curved-surface machining method of the invention offers a surface machining method characterized by forming the specified pattern of a photosensitive resist layer which is formed on a surface of a workpiece material by means of beaming a light beam via compensation means which compensate a photomask upon which is formed the specified pattern as well as the pattern of the photomask, thereby forming the specified pattern on the resist layer, the machined surface being the workpiece surface which corresponds to the pattern of the resist layer by means of simultaneous etching of the workpiece material and the resist layer upon which is formed the specified pattern of the workpiece material surface, and a surface machining apparatus for the same.

With the original-image formation technology, the light transmission rate profile of the original design formed on the photomask has a stepwise configuration when examined microscopically (see FIG. 2A). For this reason, when the light transmitted through the photomask is beamed directly on the positive photoresist layer of the workpiece surface, the stepwise pattern of the original design of the photomask is transcribed directly, and a smooth curved surface cannot be obtained.

Accordingly, the present invention performs Fourier transformation upon the light transmitted through the photomask by, for example, causing incidence upon a Fourier transform lens provided behind the photomask as the means of compensation. Here, the spectrum of the Fourier-transformed light contains low-frequency optical components, and high-frequency optical components which may cause roughening in the curved-surface machining (see FIG. 3); these converge on the focal plane behind the Fourier transform lens, forming a Fourier transformation effect. At this time, the low-frequency optical components converge in the proximity of the optical axis and the high-frequency optical components which may cause roughening in the curved-surface-machining converge at a location away from the optical axis. Utilizing these characteristics, the aperture removes the high-frequency optical components at the focus behind the Fourier transform lens, allowing only the low-frequency optical components to be transmitted.

In this way, the low-frequency optical components which are transmitted through the aperture are incident upon an inverse Fourier transform lens located at a position away from the aperture equal to the focusing distance and undergo inverse Fourier transformation, and this light is then beamed onto the positive photoresist layer on the workpiece surface. By these means, the pattern of the original design of the photomask is transcribed onto the positive photoresist layer, but because the high-frequency optical components which may cause toughening in the curved-surface machining have been removed as has been described above, the intensity profile of the light which is beamed onto the positive photoresist layer of the workpiece surface is smoothed as shown in FIG. 2B, and a smooth curved surface is transcribed onto the positive photoresist layer.

As the foregoing description has made clear, according to the present invention, light which passes through the photomask undergoes Fourier transformation by calibration means such as, for example, a Fourier transform lens, the high-frequency optical components which may cause roughening of curved-surface machining are made to converge at a location away from the optical axis, these are then removed with the aperture, and the remaining low-frequency optical components alone undergo inverse Fourier transformation with an inverse Fourier transform lens and are beamed onto the positive photoresist layer of the workpiece surface. Because of this, the intensity profile of the light beamed onto the positive photoresist layer of the workpiece surface can be made smooth, and a smooth curved surface can be formed on the positive photoresist layer. Moreover, because the curved-surface machining of this invention differs from the beam scanning of the prior art in that the entire workpiece can be machined simultaneously (no scanning is required), the roughness of the machined surface arising with the beam scanning of the prior art is eliminated, and along with this, machining times can be shortened, and precision smooth curved surfaces can be micromachined on the workpiece with good efficiency.

BRIEF DESCRIPTION OF THE DRAWINGS

FIG. 4 is an illustration of the tone scaling of the photomask using the dither system;

FIGS. 5A to 5C are process diagrams describing the curved-surface machining process;

FIG. 6 is a characteristic chart indicating the relationship between the pressure of the gas mixture and the etching rate;

DETAILED DESCRIPTION OF THE PREFERRED EMBODIMENT

Figure 1:
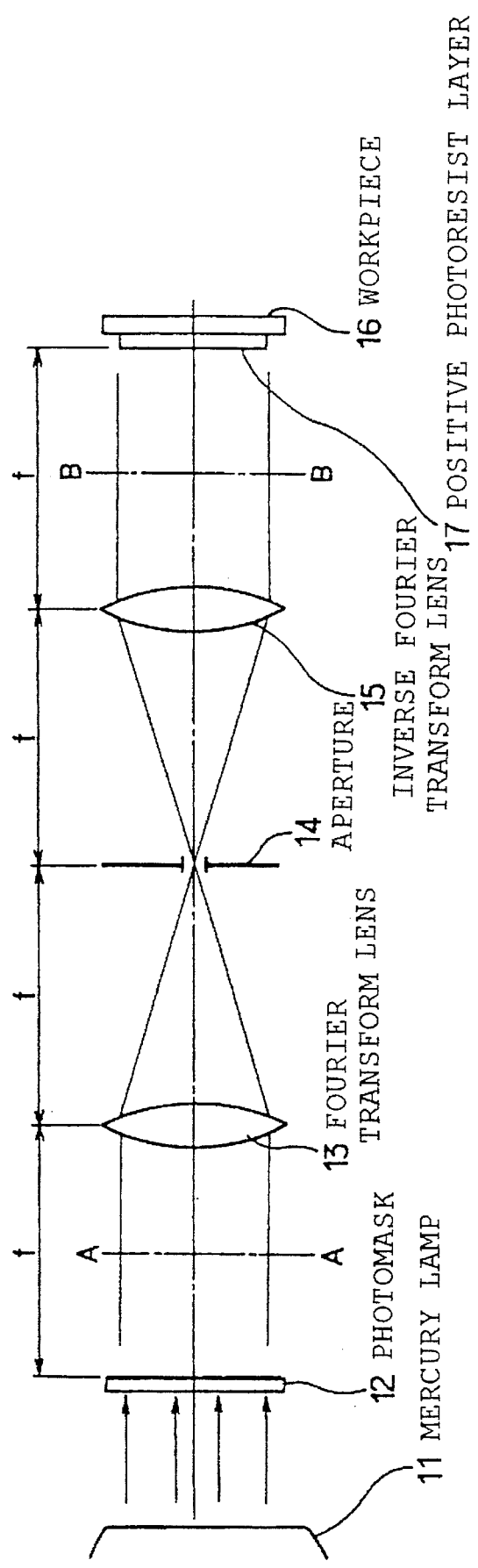
FIG. 1 is a schematic of the entire surface machining apparatus indicated in the embodiment of the invention.

One embodiment of the present invention is described below with reference to FIGS. 1 to 6. The overall structure of the device is described first. In this embodiment, a mercury lamp 11 which generates light of a wavelength that can be easily sensed by the positive photoresist may be employed as the light source. The light emitted from this mercury lamp 11 becomes virtually parallel light with a uniform intensity, and is perpendicularly incident upon the photomask 12. By using a mercury lamp 11 which emits white light, the effects of light interference within the positive photoresist layer 17 described below are lessened.

Meanwhile, the photomask 12 is fabricated so as to have a stepwise light transmission rate profile of the original design to be machined, and the intensity profile of the light from the mercury lamp 11 is given from this light transmission rate profile. In this embodiment, the dither system which is used to represent halftone images in facsimiles and the like may be employed as the system for obtaining the stepwise light transmission rate profile which serves as the original design through the photomask 12, thereby enabling the intensity modulation of, for example, 37 tones. As shown in FIG. 4, this dither system may take a space of, for example, 12 μm×12 μm as one dither unit 18, which is further divided into, for example, 6×6=36 pixels. Each pixel is established as a white pixel which transmits 100% of the light or a black pixel which blocks 100% of the light, and the tone (optical energy) of each dither unit 18 is determined by the ratio of white pixels and black pixels.

The method of fabrication of the photomask 12 using this dither system involves first depositing chromium on a glass substrate; the chromium film is allowed to remain in areas of black pixels which block 100% of the light, and is removed by etching or the like in areas of white pixels which transmit 100% of the light. The pattern of this dither unit 18 is arranged appropriately on the photomask 12 to give the intensity profile to the transmitted light, but in cases of continuous adjoining dither units 18 of identical tone, care is required for the layout pattern of the white and black pixels of the dither units 18. This is because when there are continuous adjoining dither units 18 with the same layout pattern of white and black pixels, the regularity of the layout pattern of the white and black pixels may cause it to function as a diffraction grating, the transmitted light may undergo diffraction, and the specified transmitted light may not be obtained. In order to avoid this, then in cases when there are continuous adjoining dither units 18 of identical tone, it is necessary to randomly vary the layout pattern of the white and black pixels of each dither unit 18. In this case, needless to say, because the tone of the dither unit 18 is determined by the ratio of white pixels and black pixels, then as long as this ratio is not changed, the tone of the dither unit will not vary.

Meanwhile, a Fourier transform lens 13 is provided behind the photomask 12 at a position equal in distance to the focal length f, so that the light transmitted through the photomask 12 is incident upon the Fourier transform lens 13. The imaging characteristics of this Fourier transform lens 13 are indicated by the following expression (1).

$$d = f \cdot \sin \theta \ldots \quad (1)$$

Here, d: Distance from the optical axis of the light imaged on the focal plane to the rear f: Focal distance of the Fourier transform lens 13

θ: Angle formed by the light incident on the Fourier transform lens 13 and the optical axis The spectrum of the light transmitted through this Fourier transform lens 13 includes low-frequency optical components and high-frequency optical components which may cause roughening of the curved-surface machining (see FIG. 3), and these converge on the focal plane behind the Fourier transform lens, forming a Fourier transformation effect. At this time, the low-frequency optical components converge in the proximity of the optical axis, and the high-frequency optical components which may cause roughening in the curved-surface machining converge at a location away from the optical axis. Expression (2) below expresses this relationship mathematically.

$$d = f \cdot F \cdot \lambda \ldots \quad (2)$$

Here, F is the spatial frequency included in the Fourier transformation effect.

As expression (2) makes clear, the relationship is such that the higher is the spatial frequency, the proportionally distance from the optical axis is the location of imaging. In order to satisfy this relationship rigorously, however, it is necessary to rigorously satisfy the relationship of the foregoing expression (1) as the imaging characteristics of the Fourier transform lens 13. With the present invention, however, it is acceptable to have a clear understanding of where the particular spatial frequency components are focused, and it is not necessarily required that the relationship of the foregoing expression (1) be rigorously satisfied. That is to say, the Fourier transform lens 13 in this case is not required, optically speaking, to be a strict Fourier transform lens.

Meanwhile, an aperture 14 is provided perpendicularly to the optical axis at the focal point to behind the Fourier transform lens 13. The structure of this aperture 14 is an optically opaque plate in the center of which is formed a circular hole, and the center of this circular hole coincides with the optical axis. By utilizing the foregoing expression (2) to suitably establish the diameter of this circular hole in the aperture 14, the high-frequency optical components which can cause toughening of the curved-surface machining are removed from the Fourier transformed light, and only the residual low-frequency optical components are transmitted. In addition, the aperture 14 is not limited to the aforementioned structure, but may have a structure whereby, for example, a metallic film is deposited on a glass substrate, and a circular hole is formed in the center of this film by etching or similar means.

An inverse Fourier transform lens 15 is provided behind this aperture 14 at a position equal in distance to the focal length f, so that the low-frequency optical components transmitted through the aperture 14 is incident upon the inverse Fourier transform lens 15. A workpiece 16 is provided behind this inverse Fourier transform lens 15 perpendicularly to the optical axis at a position equal in distance to the focal length f, so that the light which has undergone inverse Fourier transformation by the inverse Fourier transform lens 15 is beamed upon the positive photoresist layer 17 which has been applied to the surface of the workpiece 16 at the specified thickness.

In this embodiment, an item with the same focal length f as the Fourier transform lens 13 described above is used as the inverse Fourier transform lens 15, so that the original design pattern of the photomask 12 is transmitted through these two lenses 13 and 15 and is transcribed to the positive photoresist layer 17 on the surface of the workpiece 16 at a 1:1 scale. At this time, if the resolution of each of the lenses 13 and 15 is excessively high, the original design pattern of the photomask 12 is exposed without change, and intensity modulation of the light is not possible. Because of this, it is necessary to perform exposure which is slightly out of focus by using lenses with somewhat poor resolution (lenses with a resolution of from 10 μm to several tens of μm in the case when the dither unit 18 of 12 μm×12 μm shown in FIG. 4 is used). For this reason, the lenses 13 and 15 of this embodiment utilize lenses with a resolution of from 10 μm to several tens of μm.

A curved-surface machining device of the structure described above is used to explain the procedure for machining a smooth curved surface on the surface of a workpiece 16 composed, for example, of monocrystalline silicon.

Positive photoresist is first applied to the surface of the workpiece 16, to form the positive photoresist layer 17. At this time, the thickness of the positive photoresist layer 17 is formed so as to be equal to or slightly thicker than the height (depth) of the curved surface to be machined. This workpiece 16 is then positioned at the focal point behind the inverse Fourier transform lens 15, the mercury lamp 11 is illuminated, and exposure begins (see FIG. 5A).

Figure 2A:
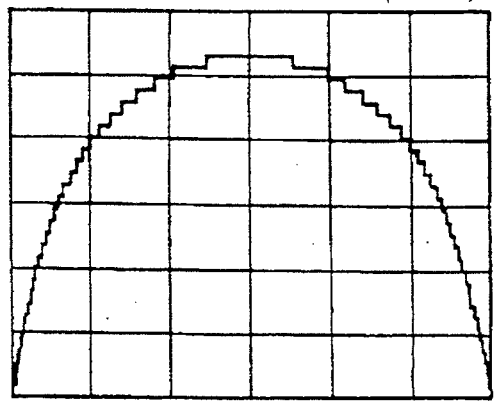
FIG. 2A is a chart of the intensity profile of the light which is transmitted through the photomask.

In this case, the light emitted from this mercury lamp 11 becomes virtually parallel light with a uniform intensity, and is perpendicularly incident upon the photomask 12. The light transmitted through this photomask 12 assumes an intensity profile which corresponds roughly to the curved surface which is to be machined, but the original design pattern of the photomask 12 has a stepwise optical energy profile because of the method of fabricating the photomask 12 described above, and so the light transmitted through the photomask 12 comes to have a stepwise intensity profile as shown in FIG. 2A, without assuming a smooth intensity profile.

The light having this manner of stepwise intensity profile is incident upon the Fourier transform lens 13, and a Fourier transformation effect having the optical intensity profile described above is formed at the focal plane behind the Fourier transform lens 13. At this time, the low-frequency optical components converge in the proximity of the optical axis, as is made clear by expression (2) earlier, and converge at a position away from the optical axis. Utilizing this relationship, the high-frequency optical components which cause toughening of the curved-surface machining are eliminated by the aperture 14 positioned at the focal point behind the Fourier transform lens 13, and only the residual low-frequency optical components are transmitted.

In this manner, the low-frequency optical components transmitted through the aperture 14 are incident upon the inverse Fourier transform lens 15 and undergo inverse Fourier transformation, and this light is beamed onto the positive photoresist layer 17 on the surface of the workpiece 16. By these means, the original design pattern of the photomask 12 is transcribed to positive photoresist layer 17, but because the high-frequency optical components which cause roughening of the curved-surface machining have been removed from the beamed light as has been described above, the intensity profile of the light beamed onto the positive photoresist layer 17 on the surface of the workpiece 16 is smoothed as is shown in FIG. 5B. For this reason, when this is developed after exposure, the exposed portion is etched so as to accurately copy the smooth intensity profile of the light, and a smooth curved surface is formed on the positive photoresist layer 17 as shown in FIG. 5B.

Next, as shown in FIG. 5C, the positive photoresist layer 17 and workpiece 16 are dry-etched in a plasma mixture of carbon tetrachloride ($CF_4$) and oxygen ($O_2$) by means of the reactive-ion etching (RIE) method. During this dry etching, the oxygen etches the positive photoresist layer 17, and the carbon tetrachloride etches the workpiece 16; however, because the RIE processing proceeds perpendicularly to the machined surface, as is indicated by the arrow in FIG. 5C, the curved-surface configuration formed on the positive photoresist layer 17 is transcribed unchanged to the workpiece 16 (silicon). At this time, as shown in FIG. 6, the machining rate ratio of the positive photoresist layer 17 and workpiece 16 (silicon) can be adjusted by appropriately setting the pressure of the gas mixture of carbon tetrachloride and oxygen.

The method of utilization of curved-surface machining described above may be applied, for example, to the machining of a dynamic-focusing concave mirror. This dynamic-focusing concave mirror flexes a thin circular silicon diaphragm into a concave configuration with electrostatic force, and the concavity is used as a mirror surface. Optically, it is preferable for this mirror surface to be parabolic, but if the film thickness of the silicon diaphragm is uniform, the deformed configuration becomes a biquadratic curved surface, and large aberration is produced. In order to avoid this, it is acceptable to calculate the film thickness profile of the silicon diaphragm in advance by means of simulations or the like, and achieve the film thickness profile by the aforementioned curved-surface machining method.

Another method of utilization is the application for microlens formation. In this case, the workpiece 16 uses quartz glass ($SiO_2$) in place of silicon. This machining process requires a change in the pressure of the gas mixture because the machining rate ratio of the positive photoresist and the quartz glass in dry etching is different from the case with positive photoresist and silicon, but in other respects this method is completely identical with the case when silicon is used. The characteristics (simulation values) of microlenses fabricated with this curved-surface machining method are shown in Table 1 following.

TABLE 1

| Simulation results (lens film thickness-10 μm) | | |
|---|---|---|
| Lens diameter (μm) | Focal length (μm) | Spot size (μm) |
| 200 | 1000 | 10.3 |
| 270 | 2000 | 10.4 |
| 330 | 3000 | 12.2 |
| 420 | 5000 | 17.2 |
| 600 | 10000 | 25.6 |

Because the thickness of this microlens cannot be made very large in comparison with the thickness of the positive photoresist layer, it is here set at, for example, 10 μm. Because of this, the relationship between the diameter and the focal distance of the microlens is determined automatically, as shown in the foregoing Table 1. The spot size of the focal point when parallel light is made incident on this microlens is as shown in the foregoing Table 1. As this Table 1 makes clear, it is understood that this is not a completely aberration-free lens, but that the spot size can be reduced to a certain extent.

Figure 7:
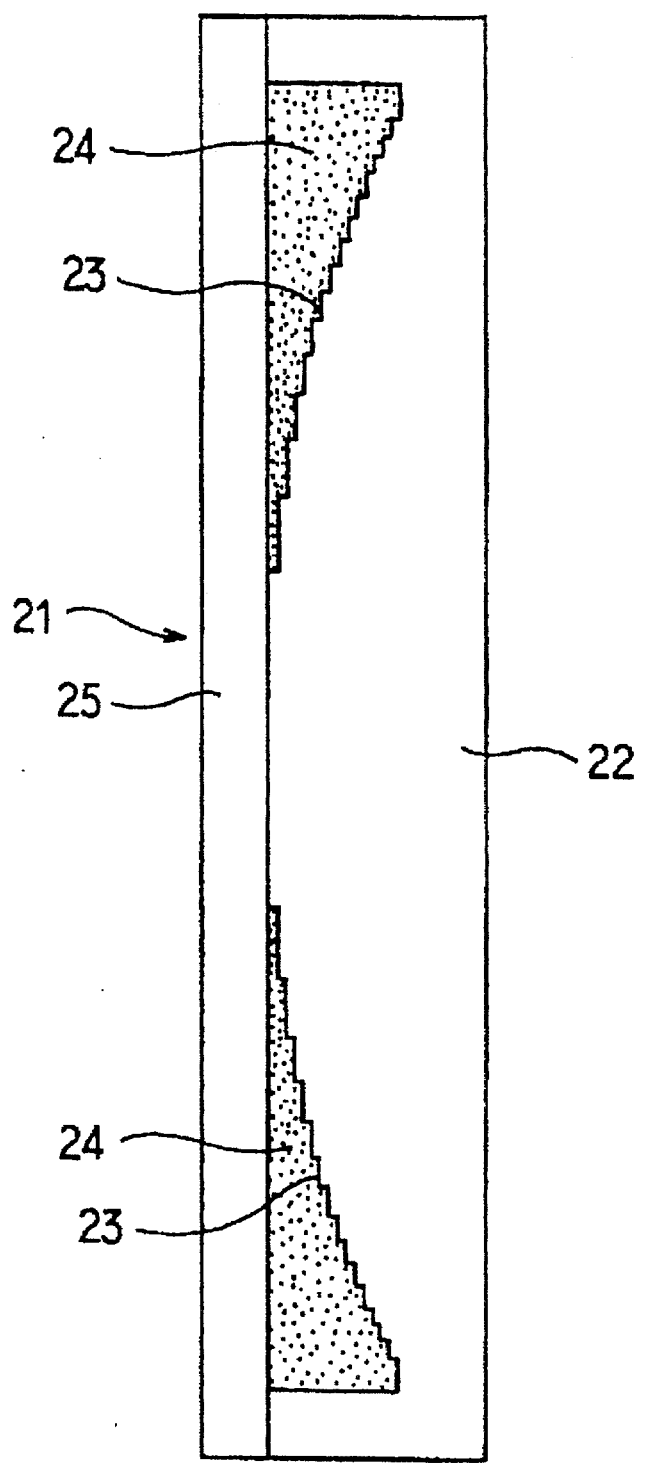
FIG. 7 is an enlarged sectional view depicting another embodiment of the photomask.

As an incidental comment, the tones of the photomask 12 in the embodiment described above were formed with the dither system, but it is also acceptable to use a photomask 21 such as that depicted in FIG. 7. This photomask 21 has a structure wherein a stepped concavity 23 is formed on the quartz glass 22, liquid 24 into which pigment is dissolved is put into this concavity 23, and sealing with a cover glass 25 is performed. Fabrication is by means of the following process.

Figure 8A:
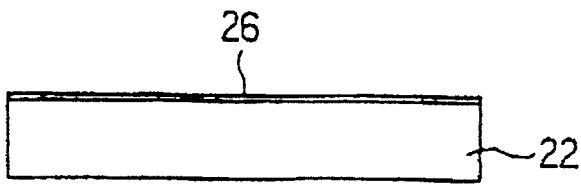
FIGS. 8A to 8H are process diagrams describing the fabrication processes for the photomask.
Figure 8B:
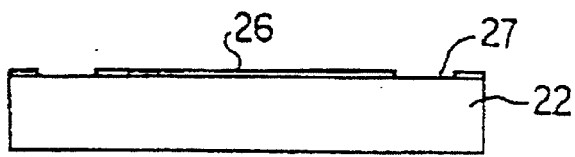
Figure 8C:
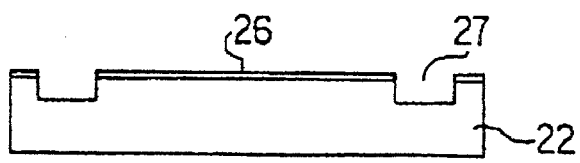
Figure 8D:
Figure 8E:
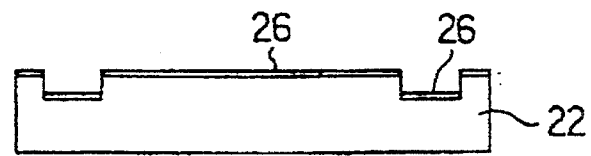
Figure 8F:
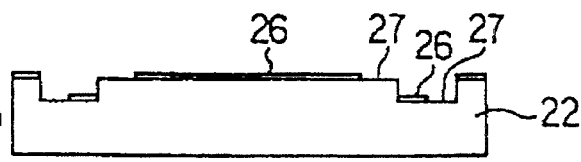
Figure 8G:
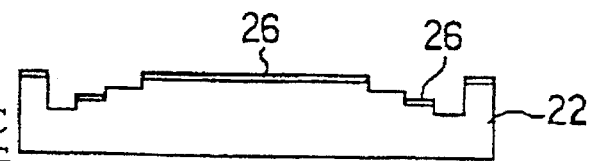
Figure 8H:
Figure 9:
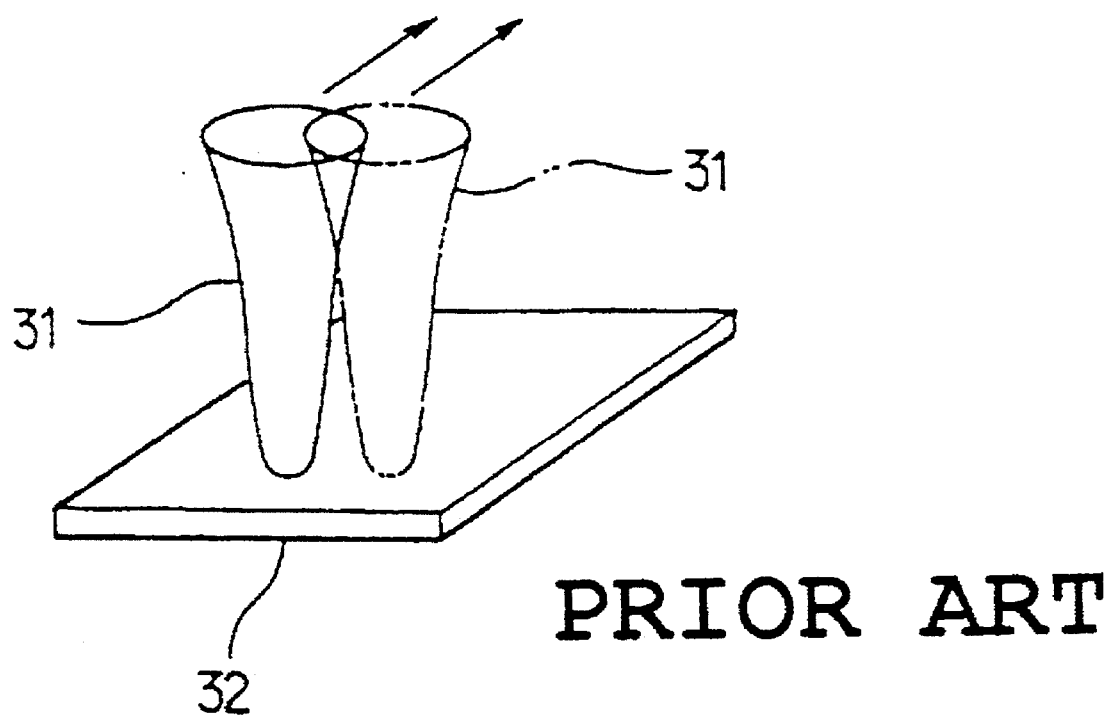
FIG. 9 is a perspective view describing the curved-surface machining with the beam scanning of the prior art.

First, after applying positive photoresist 26 to the surface of the quartz glass 22 as shown in FIG. 8A, this positive photoresist 26 is exposed and developed as shown in FIG. 8B, and an annular window 27 of the appropriate diameter is made on this. Next, as shown in FIG. 8C, the exposed portion of the quartz glass 22 is etched with hydrofluoric acid (HF) via the window 27 to form a concavity at the same location as the window 27, after which, as shown in FIG. 8D, the positive photoresist 26 is removed. The first etching is thereby completed, after which, as shown in FIG. BE, positive photoresist 26 is again applied to the entire surface of the quartz glass 22 (including the concavity), and exposure and development (FIG. 8F), hydrofluoric acid etching (FIG. 8G), and resist removal (FIG. 8H) are repeated. If a window 27 is formed at each step in the second and subsequent exposure and development, as shown in FIG. 8F, the number of steps can be doubled with a single hydrofluoric acid etching. By repeating this manner of hydrofluoric acid etching, a concavity of four steps, eight steps, 16 steps, 32 steps, 64 steps, and so on can be formed. In addition, the microlenses of the foregoing Table 1 were fabricated using a photomask 21 formed in 32 steps.

Figure 2B:
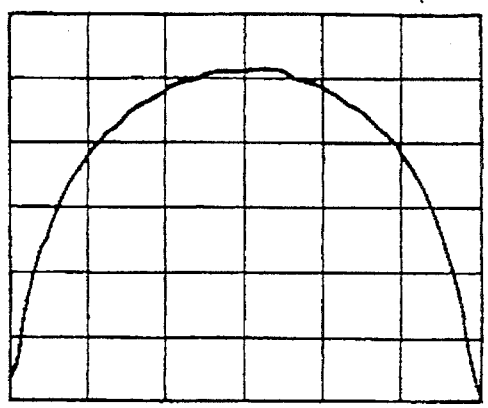
FIG. 2B is a chart of the intensity profile of the light which is transmitted through the inverse Fourier transform lens.
Figure 3:
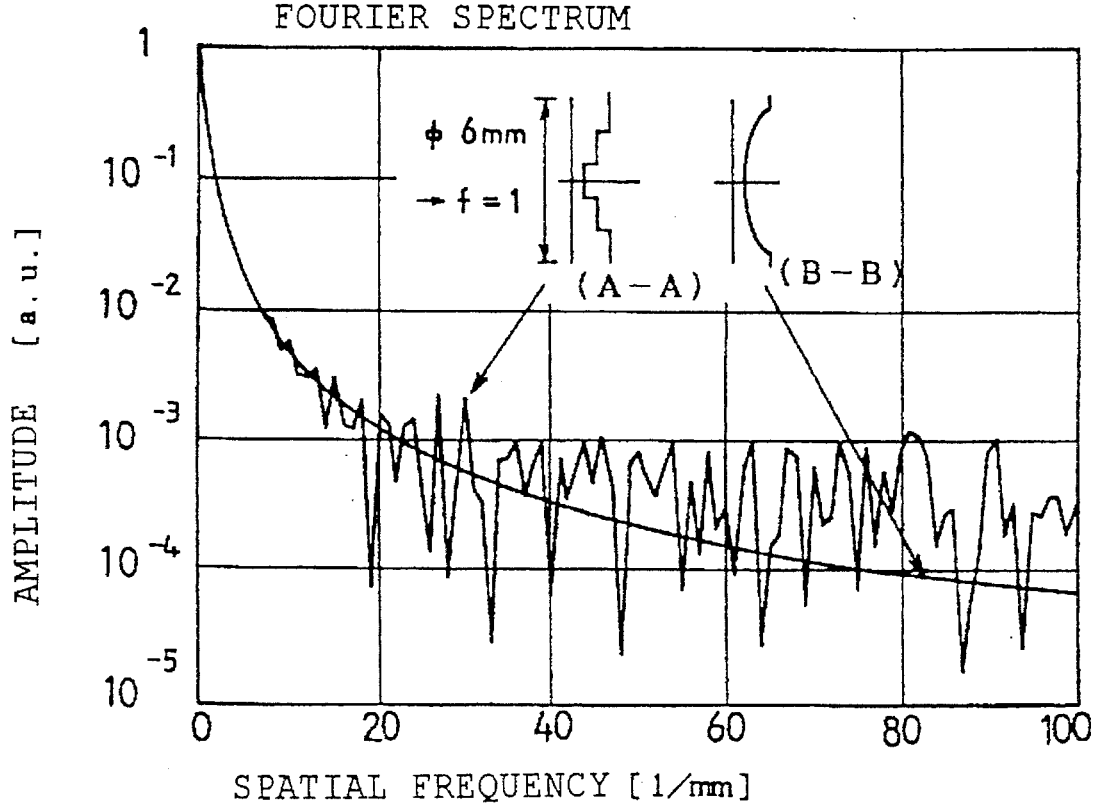
FIG. 3 is a graph of the Fourier spectrum of the light.

As the foregoing description makes clear, according to this embodiment, the light transmitted through the photomask 12 undergoes Fourier transformation by the Fourier transform lens 13, the high-frequency optical components which cause toughening of the curved-surface machining are made to converge at a location away from the optical axis, these are removed by the aperture 14, the residual low-frequency optical components alone are passed through the aperture 14 and undergo inverse Fourier transformation with the inverse Fourier transform lens 15, and this light is beamed onto the positive photoresist layer 17 on the surface of the workpiece 16; the intensity profile of the light beamed onto the positive photoresist layer 17 on the surface of the workpiece 16 can be smoothed as shown in FIG. 2B, and a smooth curved surface can be formed on the positive photoresist layer 17. Moreover, the curved-surface machining of this embodiment differs from the case of the beam scanning of the prior art in that the entire workpiece surface can be machined simultaneously (no scanning is required), and so the roughness of the machined surface arising with the beam scanning of the prior art is eliminated, and, along with this, machining times can be shortened, and precision smooth curved surfaces can be micromachined on the workpiece 16 with good efficiency.

Additionally, with the present embodiment an item with the same focal length f as the Fourier transform lens 13 is used as the inverse Fourier transform lens 15, and the original design pattern of the photomask 12 is passed through these two lenses 13 and 15 so as to be transcribed to the positive photoresist layer 17 on the surface of the workpiece 16 at a 1:1 scale. However, it is acceptable to make the focal distances of these two lenses 132 and 15 mutually different so as to reduce or enlarge the original design pattern of the photomask 12 for transcription to the positive photoresist layer 17.

In addition, with the present embodiment the photomask 12 is provided at the focal point in front of the Fourier transform lens 13, but this is not exclusive, and it is acceptable to move the established position of the photomask 12 closer to or farther from the focal point of the Fourier transform lens 13. Simultaneously, the established position of the workpiece 16 is not exclusively the focal point behind the inverse Fourier transform lens 15; it is also acceptable to move the established position of the workpiece 16 closer to or farther from the focal point of the inverse Fourier transform lens 15.

In other respects, it is needless to say the present invention can be varied within a range that does not deviate from the its spirit; i.e., it is acceptable to vary the etching method or light source, or to machine a workpiece other than silicon, and so on.

We claim:

1. A surface machining method comprising the steps of:
   beaming a light beam through a compensation device and onto a surface to be machined;
   forming a pattern on a photosensitive layer on said surface using said light beam; and
   etching said surface.

2. A surface machining method comprising the step of:
   providing a source for a light beam, a photomask having a first specified pattern, a compensation device for compensating said light beam passed through said first specified pattern, a workpiece material, and a photosensitive resist layer formed on a surface of said workpiece;
   beaming said light beam through said photomask, through said compensation device, and onto said photosensitive resist layer;
   forming a second specified pattern on said photosensitive resist layer with said light beam having passed through said compensation device; and
   etching said photosensitive resist layer.

3. The surface machining method according to claim 2, wherein said providing step includes providing said compensation device for selecting only specified spatial frequency components of said light beam.

4. The surface machining method according to claim 3, wherein said providing step includes using a Fourier transform lens as said compensation device and selecting said specified spatial frequency components to be spatial frequency components which exist proximate an optical axis of said Fourier transform lens.

5. The surface machining method according to claim 3, wherein said providing step includes providing a Fourier transform lens, an inverse Fourier transform lens, and an aperture material provided between said Fourier transform lens and said inverse Fourier transform lens at a position where mutual focal points of said Fourier transform lens and said inverse Fourier transform lens exist.

6. The surface machining method according to claim 5, wherein said beaming step includes sequentially transmitting said light beam passed through said photomask through said Fourier transform lens, said aperture material, and said inverse Fourier transform lens.

7. The surface machining method according to claim 6, wherein said beaming step includes transforming certain spatial frequency components of said light beam passed through said photomask by means of said Fourier transform lens to produce a Fourier-transformed light beam.

8. The surface machining method according to claim 7, further comprising the step of selectively transmitting said certain spatial frequency components by means of said aperture material.

9. The surface machining method according to claim 8, wherein said certain spatial frequency components are spatial frequency components which exist proximate an optical axis of said Fourier transform lens.

10. A surface machining method comprising the steps of:

providing a photomask having a first specified pattern formed thereon;

directing a light beam perpendicularly incident onto said photomask;

receiving said light beam transmitted through said photomask;

transforming said light beam to a Fourier-transformed light beam by having said beam incident upon a Fourier transform lens;

restricting said Fourier-transformed light beam by an aperture provided at a focal point behind said Fourier transform lens;

transmitting only specified spatial frequency components;

directing said specified spatial frequency components to be incident upon an inverse Fourier transform lens provided at a position located away from said aperture at a distance equal to a focal length thereof and subjecting said specified spatial frequency components to inverse Fourier transformation;

beaming said inverse-Fourier-transformed light beam onto a resist layer which is formed on the surface of a workpiece; and forming a second specified machining pattern corresponding to said first pattern on said resist layer by means of developing said resist layer upon which said light beam has been beamed.

11. The surface machining method according to claim 10, further comprising the step of providing a positive photoresist layer as said resist layer.

12. The surface machining method according to claim 10, wherein said specified spatial frequency components are spatial frequency components existing proximate an optical axis of said Fourier transform lens.

13. A surface machining apparatus comprising:

a light source;

a photomask provided such that a light beam from said light source is incident thereon and said photomask has a first specified pattern formed thereon;

compensation means for transforming said light beam that has been transmitted through said photomask to a pattern of each spatial frequency contained in said light beam; and means for beaming said light beam that has been transmitted through said compensation means upon a workpiece having a photosensitive resist layer of the specified thickness formed on a surface thereof.

14. The surface machining device according to claim 13, wherein said compensation means includes a Fourier transform lens upon which light transmitted through said photomask is incident;

an aperture which is provided at a focal point of said Fourier transform lens and which passes only specified spatial frequency components that have passed through said Fourier transform lens; and an inverse Fourier transform lens which is provided at a location away from said aperture at a distance equal to a focal length thereof, and upon which are incident the specified spatial frequency components which have passed through said aperture.

15. The surface machining device according to claim 13, wherein said specified spatial frequency components are spatial frequency components which exist proximate an optical axis of said Fourier of said Fourier transform lens.

16. A surface machining device comprising:

a light source for producing a light beam;

a photomask provided such that said light beam is incident thereon and said photomask has a first specified pattern thereon;

a Fourier transform lens upon which is incident light which is transmitted through said photomask;

an aperture provided at a focal point of said Fourier transform lens and passing only specified spatial frequency components that have passed through said Fourier transform lens; and an inverse Fourier transform lens provided at a location away from said aperture at a distance equal to a focal length thereof, and upon which are incident the specified spatial frequency components which have passed through said aperture;

means for providing a workpiece upon a surface of which is formed a resist layer of a specified thickness disposed behind said inverse Fourier transform lens so that light transmitted through said inverse Fourier transform lens is beamed on said resist layer.

17. The surface machining device according to claim 16, wherein said resist layer is a positive photoresist layer.

18. The surface machining apparatus according to claim 16, wherein said specified spatial frequency components are spatial frequency components which exist proximate an optical axis of said Fourier transform lens.

\* \* \* \* \*